United States Patent
Huang (10) Patent No.: US 9,442,483 B2
(45) Date of Patent: Sep. 13, 2016

(54) MANUFACTURING CONTROL APPARATUS AND MANUFACTURING CONTROL SYSTEM

(71) Applicant: Kabushiki Kaisha Toshiba, Tokyo (JP)

(72) Inventor: Linting Huang, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 524 days.

(21) Appl. No.: 13/835,117

(22) Filed: Mar. 15, 2013

(65) Prior Publication Data

US 2013/0338810 A1 Dec. 19, 2013

(30) Foreign Application Priority Data

Jun. 13, 2012 (JP) ................................ 2012-134282

(51) Int. Cl.
G05B 23/02 (2006.01)
G05B 13/02 (2006.01)
(Continued)

(52) U.S. Cl.
CPC ............ *G05B 23/024* (2013.01); *G05B 13/02* (2013.01); *G05B 19/41875* (2013.01); *G06F 17/16* (2013.01); *G06F 17/18* (2013.01); *H01L 21/67253* (2013.01); *H01L 22/12* (2013.01); *H01L 22/20* (2013.01); *G05B 2219/32179* (2013.01); *G05B 2219/32191* (2013.01); *G05B 2219/32201* (2013.01); *Y02P 90/22* (2015.11)

(58) Field of Classification Search
CPC .................... G05D 9/00–9/12; G05B 23/024; G05B 2219/32181; G05B 2219/32191; G05B 2219/32201; H01L 21/67253; H01L 22/12; H01L 22/20; G06F 17/16; G06F 17/18

USPC .......... 700/108, 110; 702/81, 182, 185, 189; 703/2
See application file for complete search history.

(56) References Cited

U.S. PATENT DOCUMENTS 5,781,432 A * 7/1998 Keeler et al. .................... 700/44
6,556,959 B1 * 4/2003 Miller .............. G05B 19/41885
257/E21.525
(Continued)

FOREIGN PATENT DOCUMENTS

CN 101023522 B 5/2010
CN 101847568 A 9/2010
(Continued)

OTHER PUBLICATIONS

Office Action issued Jun. 26, 2014 in Japanese Patent Application No. 2012-134282 (with English language translation).
(Continued)

*Primary Examiner* — Crystal J Barnes-Bullock
(74) *Attorney, Agent, or Firm* — Oblon, McClelland, Maier & Neustadt, L.L.P.

(57) ABSTRACT

A manufacturing control apparatus of an electronic device is configured to implement processing to generate a first model function relating to a relationship between a characteristic of a component included in the electronic device. The apparatus is configured to implement processing to determine a first manufacturing condition value to obtain the characteristic of the component based on the first model function. The apparatus is configured to implement processing to calculate a squared prediction error of a measured value of the characteristic of the component. The apparatus is configured to implement processing to determine a second manufacturing condition value of the next electronic device according to the calculated squared prediction error.

14 Claims, 8 Drawing Sheets

(51) Int. Cl.
  *G06F 17/16* (2006.01)
  *G06F 17/18* (2006.01)
  *H01L 21/67* (2006.01)
  *H01L 21/66* (2006.01)
  *G05B 19/418* (2006.01)

(56) References Cited

U.S. PATENT DOCUMENTS

| | | | |
|---|---|---|---|
| 6,564,114 B1* | 5/2003 | Toprac | G01N 21/71 216/59 |
| 6,597,447 B1* | 7/2003 | Stirton et al. | 356/237.2 |
| 6,871,114 B1* | 3/2005 | Green et al. | 700/110 |
| 6,905,895 B1* | 6/2005 | Coss, Jr. et al. | 438/16 |
| 6,934,596 B2* | 8/2005 | Yoshida et al. | 700/109 |
| 6,985,779 B2* | 1/2006 | Hsiung | G05B 15/02 700/17 |
| 7,198,964 B1* | 4/2007 | Cherry | G05B 19/41875 257/E21.521 |
| 7,328,126 B2* | 2/2008 | Chamness | G05B 23/024 700/108 |
| 7,587,296 B2* | 9/2009 | Harvey, Jr. | G05B 19/41875 702/179 |
| 7,734,451 B2* | 6/2010 | MacArthur | G05B 13/0295 702/185 |
| 8,095,230 B2* | 1/2012 | Ouyang et al. | 700/99 |
| 8,103,478 B2* | 1/2012 | Good | G06K 9/6247 438/14 |
| 9,110,452 B2* | 8/2015 | Blevins | G05B 17/02 |
| 2004/0088068 A1* | 5/2004 | Kadosh | 700/108 |
| 2004/0172153 A1* | 9/2004 | Zhang et al. | 700/146 |
| 2006/0000799 A1* | 1/2006 | Doh | H01J 37/32935 216/59 |
| 2006/0200261 A1* | 9/2006 | Monette et al. | 700/108 |
| 2008/0147222 A1* | 6/2008 | McIntyre et al. | 700/108 |
| 2008/0275587 A1* | 11/2008 | Adams | G05B 23/024 700/110 |
| 2008/0306621 A1* | 12/2008 | Choi et al. | 700/110 |
| 2009/0276077 A1* | 11/2009 | Good et al. | 700/110 |

FOREIGN PATENT DOCUMENTS

| | | |
|---|---|---|
| JP | 2000-252179 A | 9/2000 |
| JP | 2005-101286 A | 4/2005 |
| JP | 2007-4728 A | 1/2007 |
| JP | 2011-175540 | 9/2011 |

OTHER PUBLICATIONS

Office Action issued Oct. 29, 2014, in Japanese Patent Application No. 2012-134282 with English translation.

Min-Hsiung Hung, et al., "A Novel Virtual Metrology Scheme for Predicting CVD Thickness in Semiconductor Manufacturing", IEEE/ASME Transactions on Mechatronics, IEEE, Jun. 2007, vol. 12, No. 3, pp. 308-316.

Combined Taiwanese Office Action and Search Report issued Jan. 28, 2015 in Patent Application No. 102120939 (with English Translation).

Huang, Linting, "Scattering of a Production Process of a Single Observation Value is Monitored by Using Self-Starting Control Figure", Publication date by the National Laboratory is Nov. 5, 2009, 15 pages.

Korean Office Action issued Dec. 23, 2014 in Patent Application No. 10-2013-0066885 (with English Translation).

Shinroku Matsuzaki et al., "Development of the Visualizing Information Technique of Blast Furnace Operation", Shinnittetsu Giho, vol. 384, 2006, pp. 89-94 (with English Abstract).

Combined Chinese Office Action and Search Report issued Jan. 20, 2016 in Patent Application No. 201310233441.1 (with English language translation).

* cited by examiner

MANUFACTURING CONTROL APPARATUS AND MANUFACTURING CONTROL SYSTEM

CROSS-REFERENCE TO RELATED APPLICATIONS

This application is based upon and claims the benefit of priority from the prior Japanese Patent Application No. 2012-134282, filed on Jun. 13, 2012; the entire contents of which are incorporated herein by reference.

FIELD

Embodiments described herein relate generally to a manufacturing control apparatus, a manufacturing control system, and a manufacturing control program of an electronic device.

BACKGROUND

When manufacturing an electronic device such as a semiconductor memory device, etc., it is important to control characteristics such as, for example, the film thickness, etc., with high precision. In particular, for a semiconductor memory device in which the memory capacity progressively increases every generation, the target specifications such as the film thickness, etc., progressively change and the control precision of the control items becomes stringent as the memory capacity increases.

DETAILED DESCRIPTION

According to one embodiment, a manufacturing control apparatus of an electronic device is disclosed. The apparatus is configured to implement processing to generate, using a first database, a first model function relating to a relationship between a characteristic of a component included in the electronic device and first neighboring condition values of a manufacturing condition value relating to the component, the first neighboring condition values including a predetermined first processing condition value and a plurality of processing condition values near the first processing condition value, the characteristic including at least one selected from a value relating to a thickness of the component and a value relating to a dimension of the component when manufactured using the manufacturing condition value, the manufacturing condition value and the characteristic being stored with a mutual correlation in the first database. The apparatus is configured to implement processing to determine a first manufacturing condition value to obtain the characteristic of the component based on the first model function. The apparatus is configured to implement processing to calculate a squared prediction error of a measured value of the characteristic of the component for the first model function using the measured value of the characteristic and a measured value of the first manufacturing condition value when actually forming the component of the electronic device using the determined first manufacturing condition value. The apparatus is configured to implement processing to set, in the case where the calculated squared prediction error is greater than a predetermined reference value, the first manufacturing condition value to be a second manufacturing condition value of the next electronic device without correcting the first model function, and to determine, in the case where the calculated squared prediction error is not more than the reference value, the second manufacturing condition value to obtain the characteristic of the component based on a second model function by generating the second model function using the first database including the addition of the measured value of the first manufacturing condition value and the measured value of the characteristic of the component of the actual forming.

According to another embodiment, a manufacturing control system of an electronic device includes a manufacturing control apparatus of the electronic device and a formation apparatus. The manufacturing control apparatus is configured to implement processing to generate, using a first database, a first model function relating to a relationship between a characteristic of a component included in the electronic device and first neighboring condition values of a manufacturing condition value relating to the component, the first neighboring condition values including a predetermined first processing condition value and a plurality of processing condition values near the first processing condition value, the characteristic including at least one selected from a value relating to a thickness of the component and a value relating to a dimension of the component when manufactured using the manufacturing condition value, the manufacturing condition value and the characteristic being stored with a mutual correlation in the first database. The manufacturing control apparatus is configured to implement processing to determine a first manufacturing condition value to obtain the characteristic of the component based on the first model function. The manufacturing control apparatus is configured to implement processing to calculate a squared prediction error of a measured value of the characteristic of the component for the first model function using the measured value of the characteristic and a measured value of the first manufacturing condition value when actually forming the component of the electronic device using the determined first manufacturing condition value. The manufacturing control apparatus is configured to implement processing to set, in the case where the calculated squared prediction error is greater than a predetermined reference value, the first manufacturing condition value to be a second manufacturing condition value of the next electronic device without correcting the first model function, and to determine, in the case where the calculated squared prediction error is not more than the reference value, the second manufacturing condition value to obtain the characteristic of the component based on a second model function by generating the second model function using the first database including the addition of the measured value of the first manufacturing condition value and the measured value of the characteristic of the component of the actual forming. The formation apparatus is configured to form the component included in the electronic device.

According to another embodiment, a manufacturing control program of an electronic device is disclosed. The program is configured to cause a computer to implement processing to generate, using a first database, a first model function relating to a relationship between a characteristic of a component included in the electronic device and first neighboring condition values of a manufacturing condition value relating to the component, the first neighboring condition values including a predetermined first processing condition value and a plurality of processing condition values near the first processing condition value, the characteristic including at least one selected from a value relating to a thickness of the component and a value relating to a dimension of the component when manufactured using the manufacturing condition value, the manufacturing condition value and the characteristic being stored with a mutual correlation in the first database. The program is configured to cause the computer to implement processing to determine a first manufacturing condition value to obtain the characteristic of the component based on the first model function. The program is configured to cause the computer to implement processing to calculate a squared prediction error of a measured value of the characteristic of the component for the first model function using the measured value of the characteristic and a measured value of the first manufacturing condition value when actually forming the component of the electronic device using the determined first manufacturing condition value. The program is configured to cause the computer to implement processing to set, in the case where the calculated squared prediction error is greater than a predetermined reference value, the first manufacturing condition value to be a second manufacturing condition value of the next electronic device without correcting the first model function, and to determine, in the case where the calculated squared prediction error is not more than the reference value, the second manufacturing condition value to obtain the characteristic of the component based on a second model function by generating the second model function using the first database including the addition of the measured value of the first manufacturing condition value and the measured value of the characteristic of the component of the actual forming.

Various embodiments will be described hereinafter with reference to the accompanying drawings.

In the specification and the drawings, components similar to those described in regard to a drawing thereinabove are marked with like reference numerals, and a detailed description is omitted as appropriate.

The embodiment relates to, for example, a manufacturing control apparatus, a manufacturing control system, a manufacturing control program, and a manufacturing control method for an electronic device such as a semiconductor memory device, a micro electromechanical element (MEMS (Micro Electro Mechanical Systems)), etc. The case will now be described where the embodiment is used to produce a semiconductor memory device. For example, the embodiment is applied to the formation process of an insulating film or the like (e.g., a silicon oxide film, a silicon nitride film, etc.) of the semiconductor memory device. The insulating film is used to form, for example, a memory unit of the semiconductor memory device. In the semiconductor memory device, it is desirable to control the film thickness and dimensions of the insulating film with high precision because the memory state greatly depends on the film thickness and dimensions of the insulating film.

In the embodiment, a characteristic including at least one selected from a value (the film thickness) relating to the thickness of a component (the insulating film) and a value (the line width, etc.) relating to a dimension of the component (the insulating film) is used as a characteristic Y of the component (e.g., the insulating film recited above) included in an electronic device (e.g., the semiconductor memory device recited above). The characteristic Y depends on a manufacturing condition value X such as film formation conditions, patterning conditions, etc. The manufacturing condition value X is a control item of a manufacturing process.

An example will now be described in which the manufacturing control apparatus, the manufacturing control system, the manufacturing control program, and the manufacturing control method according to the embodiment are used in, for example, the process of forming the insulating film by LP-CVD (Low Pressure Chemical Vapor Deposition).

Figure 1A:
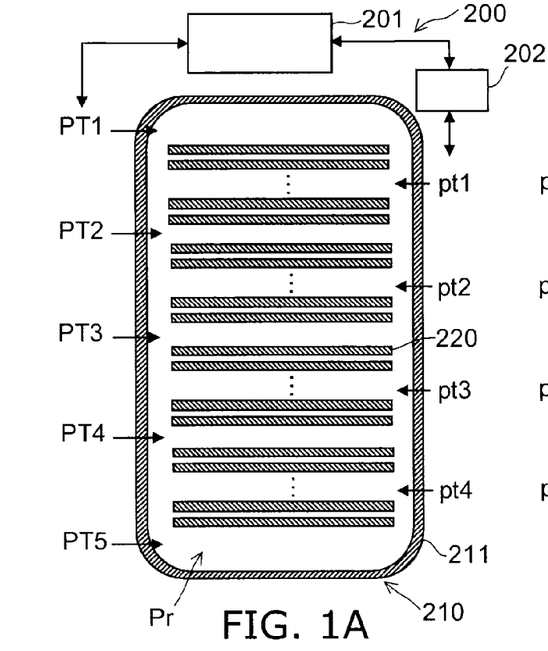
FIG. 1A to FIG. 1C are schematic views showing the configuration of the manufacturing control system of the electronic device according to the first embodiment.
Figure 1B:
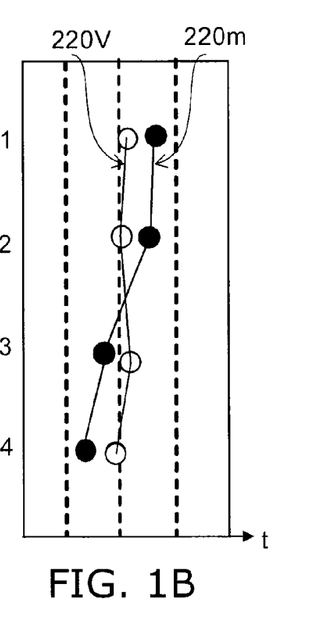
Figure 1C:
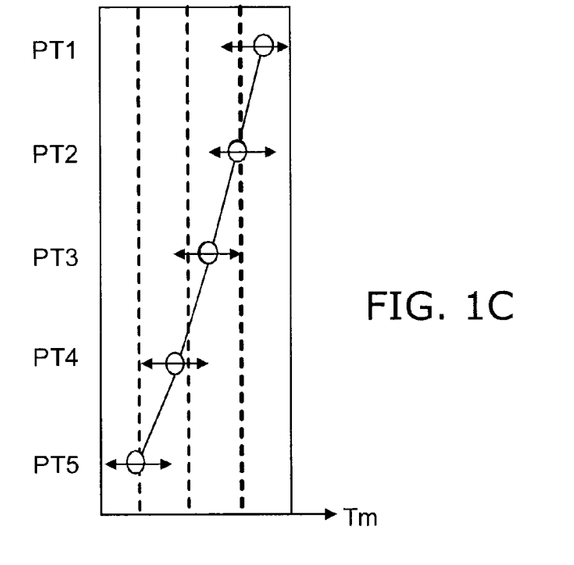

FIG. 1A to FIG. 1C are schematic views showing the configuration of the manufacturing control system of the electronic device according to the first embodiment.

As shown in FIG. 1A, the manufacturing control system 200 according to the embodiment includes a manufacturing control apparatus 201 and a manufacturing apparatus. The manufacturing control apparatus 201 includes, for example, a computer. For example, a LP-CVD apparatus 210 which is an example of the manufacturing apparatus is used as the manufacturing apparatus. The manufacturing control apparatus 201 can communicate with the LP-CVD apparatus 210 by a wired method, a wireless method, or any method. For example, it is possible to transfer information via any memory device.

As shown in FIG. 1A, multiple processing substrates (wafers 220) are disposed inside a processing chamber 211 of the LP-CVD apparatus 210. Insulating films are formed on the wafers 220 by LP-CVD. In the example of the apparatus, the temperature is settable at five positions (first to fifth temperature setting positions PT1 to PT5) inside the processing chamber. Other than the temperature, processing conditions such as the pressure Pr, the power (the electrical supply power), the film formation time, etc., are settable during the processing of the LP-CVD apparatus 210. To simplify the description, the case will be described where the insulating film having the desired film thickness and distribution is formed by setting the power to be constant and adjusting the temperature (in this example, the temperatures at five positions), the film formation time, and the pressure Pr. The pressure Pr may be constant. In the embodiment, the positions and the numbers of the temperature settings are arbitrary.

Test pieces are included in the multiple wafers 220; and film thicknesses of the test pieces are actually measurable. The film thickness corresponds to the characteristic Y. In the example, the test pieces are disposed at four positions (first to fourth test piece positions pt1 to pt4). The embodiment is not limited thereto; and the disposition and number of the test pieces are arbitrary.

From the aspect of the production volume, it is favorable for the number of the test pieces to be low because the test pieces are not wafers used to form electronic devices. It is favorable for the test pieces to be disposed not in all of the film formation lots and all of the processing batches but in designated lots and designated processing batches. In other words, from the aspect of the production volume, it is favorable for the measurement frequency of the film thickness to be low. On the other hand, from the aspect of monitoring the fluctuation of the film thickness, etc., with high precision, it is favorable for the measurement frequency of the film thickness to be high.

The manufacturing control system 200 may further include a measuring apparatus (in this example, a film thickness measuring apparatus 202) of the characteristic Y. The manufacturing control apparatus 201 can communicate with the film thickness measuring apparatus 202 by a wired method, a wireless method, or any method. For example, it is possible to transfer information via any memory device.

In the embodiment, the characteristic Y (the film thickness of the insulating film) is predictable from the manufacturing condition value X (the temperature, the pressure, etc.) using the model function described below.

FIG. 1B shows an actual measured value 220m and a predicted value 220v of the film thickness t (the characteristic Y). The actual measured value 220m is an actual measured value of a film thickness t relating to a processing batch. The predicted value 220v is the value of the film thickness t predicted using the model function described below when provided with the temperature, pressure, power, and film formation time of the LP-CVD apparatus 210. In the embodiment, the manufacturing condition value X (the temperature, the pressure, etc.) is calculated such that the predicted value 220v of the characteristic Y becomes the desired characteristic.

FIG. 1C shows a set temperature Tm (an example of the manufacturing condition value X). As shown in FIG. 1C, the temperatures at the first to fifth temperature setting positions PT1 to PT5 are calculated such that the film thickness t of the predicted value 220v has the desired distribution. The calculated value is used to form the insulating film. In other words, the predicted value 220v of the film thickness t is calculated based on the data up to the previous data; and the manufacturing condition value X is fed back based on the predicted value 220v. Thereby, the precision of the film thickness t of the insulating film increases.

To perform such a control, a database (a first database), in which the manufacturing condition value X relating to the component included in the electronic device is correlated with the characteristic Y (the characteristic including the at least one selected from the value relating to the thickness and the value relating to the dimension) of the component when manufactured using the manufacturing condition value X, is provided in the manufacturing control system 200 (the manufacturing control apparatus 201). The database may be provided in a memory device inside the manufacturing control apparatus 201 or may be provided in a memory device provided separately from the manufacturing control apparatus 201.

In the example, the film thickness changes due to the temperature of the film formation and the pressure of the processing chamber 211. In other words, the temperature and the pressure are the manufacturing condition value X that is controlled as the manufacturing condition. Then, the film thickness t for the film formation at this condition is the characteristic Y. For example, the value of the temperature includes values of the temperatures at multiple positions.

The database may include values relating to the pressure of the exhaust system, the pressure and flow rate of various gases, the heater power, etc., for each processing.

To simplify the description in the following example, the temperature and the pressure are described. In other words, the manufacturing condition value X (the temperature and the pressure) and the characteristic Y (the film thickness) are stored with a mutual correlation in the database (the first database).

Figure 2:
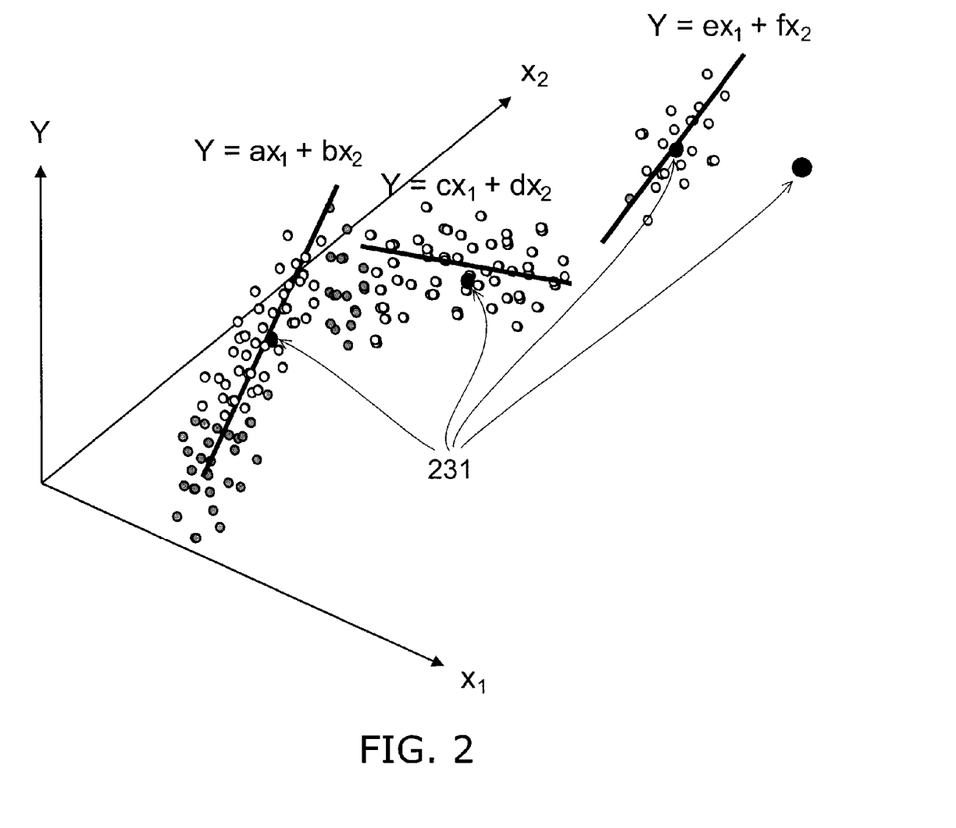
FIG. 2 is a model-like schematic view showing the database used in the manufacturing control system of the electronic device according to the first embodiment.

FIG. 2 is a model-like schematic view showing the database used in the manufacturing control system of the electronic device according to the first embodiment.

Sets of a temperature $x_1$ which is one of the manufacturing condition values X, pressure $x_2$ which is one other of the manufacturing condition values X, and the characteristic Y are plotted in FIG. 2. In the example, the characteristic Y is the value relating to the film thickness t and may be the film thickness t, the reciprocal of the film thickness t, or, for example, the film formation rate (film thickness t/film formation time). The number of sets of the data included in the database is taken as Nd. The number Nd is arbitrary and may be, for example, 1000 sets, 10000 sets, etc.

In the case where the entire database is expressed by one function, the function becomes complex; and it is difficult for the precision to be sufficiently high.

Therefore, as shown in FIG. 2, a local model is generated relating to a group (a neighboring data group) of prescribed Na sets (Na being a number less than Nd). For example, the relationship between the manufacturing condition value X and the characteristic Y of one neighboring data group is expressed by $Y = a \cdot x_1 + b \cdot x_2$. For another neighboring data group, this is expressed by $Y = c \cdot x_1 + d \cdot x_2$. For yet another neighboring data group, this is expressed by $Y = e \cdot x_1 + f \cdot x_2$. Thus, the relationship between the value of the film thickness t, the newest data 231, and the neighboring condition values (Na sets of values in all) near the newest data 231 is expressed by a prescribed function (e.g., $Y = a \cdot x_1 + b \cdot x_2$). By generating the model for the neighboring Na sets of data, a nonlinear prediction model for the entirety can be generated with high precision.

Although one value (the value at one position) is described as the temperature $x_1$ to simplify the description in the example recited above, temperatures at multiple positions may be used as described above. In such a case, the temperature $x_1$ includes multiple values for the positions. To simplify the description hereinbelow, the case is described where the temperature $x_1$ is one value.

In the embodiment, a local linear model (a local linear function) relating to such neighboring data is generated as the model function. Specifically, for example, the relationship between the value of the film thickness t (the characteristic Y of the component) and first neighboring condition values (Na sets of values in all) of the manufacturing condition value X including one predetermined processing condition value (e.g., one value relating to the temperature $x_1$ and one value relating to the pressure $x_2$) and multiple processing condition values near the processing condition value is expressed by $Y = a \cdot x_1 + b \cdot x_2$. The coefficients a and b are determined at this time.

In the case where the electronic devices are multiply produced, the amount of data relating to the manufacturing condition value X (the temperature $x_1$ and the pressure $x_2$) and the characteristic Y (the film thickness t) increases for each processing of the production. The function recited above can be renewed for each increase of the data. Thereby, a model having higher precision is obtained. There are cases where such a model is called, for example, a JIT (Just In Time) VM (Virtual Metrology) model.

The characteristic Y (the film thickness t) for one manufacturing condition value X can be predicted with higher precision using such a model. Then, the manufacturing condition value X to obtain the target film thickness is calculated by matrix inversion using the characteristic (the predicted value 220v) that is predicted. The precision of the film thickness t of the insulating film that is formed is increased by performing the processing of the production using the manufacturing condition value X that is calculated.

To obtain the value of the film thickness with high precision in the case where the predicted value is not used, it is necessary to increase the frequency of the measurement of the film thickness. In other words, the frequency and amount of work for QC (Quality Control) of the manufacturing increases. However, the production volume decreases as the frequency of the measurement is increased; and as a result, the productivity decreases. Moreover, expenses are incurred for the measurement itself. Therefore, the measurement cost increases as the measurement frequency is increased.

In the embodiment, the measurement frequency of the film thickness t can be reduced by predicting the final result of the film thickness t using the JITVM prediction model. Thereby, the measurement cost can be reduced while maintaining high precision of the value relating to the film thickness.

In the embodiment, the set temperature (and the film formation time) to obtain the target film thickness are calculated by successively generating the JITVM prediction model from the actual measured value and the predicted value and by matrix inversion. The set temperature (and the film formation time) that are calculated are fed back to the processing of the next production. In other words, in the APC (Advanced Process Control) system according to the embodiment, the film thickness is controlled while adjusting, for example, the set temperature of the LP-CVD apparatus 210. Thereby, the measurement frequency and measurement cost of the film thickness can be reduced.

In the JITVM prediction model, for example, the data inside the database increases for each processing of the production; and each time, the model function is generated successively. Thereby, the prediction precision can be increased. However, irregular data may occur in the case where an unexpected state such as process trouble, etc., occurs. It was found that, in the case where such irregular data occurs and the model function is generated using such irregular data, the characteristic Y (the film thickness t) that is the result of the actual production using the manufacturing condition value X that is calculated using the value predicted using the model function may be greatly different from the desired value.

Therefore, in the embodiment, for example, when it is estimated that irregular data has occurred, the making of the model function and the setting of the manufacturing condition value X based on the result of the model function are not implemented. Or, the model function is generated; but the manufacturing condition value X is not set based on the result. Then, the production is performed using, for example, the manufacturing condition value X one previous. When it is estimated that irregular data has not occurred, the manufacturing condition value X is set based on the result of the model function that is generated. By such processing, it is possible to control the characteristic Y (the film thickness t) with higher precision.

Figure 3:
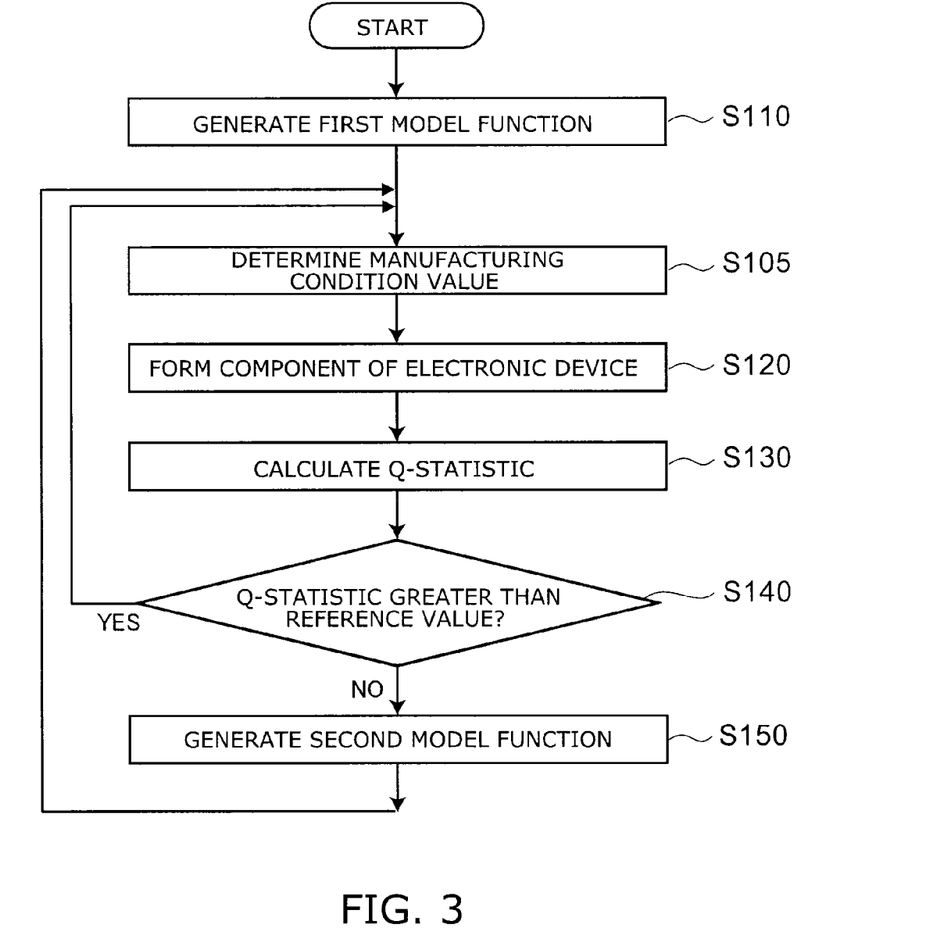
FIG. 3 is a flowchart showing the manufacturing control system of the electronic device according to the first embodiment.

FIG. 3 is a flowchart showing the manufacturing control system of the electronic device according to the first embodiment.

As shown in FIG. 3, the manufacturing control system 200 (the manufacturing control apparatus 201) according to the embodiment implements processing (step S110) to generate a first model function using a database. The first model function is generated using the database (a first database). The manufacturing condition value X relating to a component (e.g., an insulating film, etc.) included in an electronic device (e.g., a semiconductor memory device, etc.) and the characteristic Y (the characteristic including the at least one selected from the value relating to the thickness and the value relating to the dimension) of the component when manufactured using the manufacturing condition value X are stored with a mutual correlation in the database. The first model function relates to the relationship between the characteristic Y of the component (the insulating film) and first neighboring condition values of the manufacturing condition value X including a predetermined first processing condition value (e.g., the newest data 231) and multiple processing condition values near the first processing condition value. For example, the manufacturing condition value X includes the temperature x1 and the pressure x2; and the relationship recited above is expressed by, for example, $Y = a \cdot x1 + b \cdot x2$. Step S110 corresponds to determining the coefficients a and b at this time.

The manufacturing control system 200 (the manufacturing control apparatus 201) implements processing (step S105) to determine the manufacturing condition value X (the first manufacturing condition value) to obtain the characteristic of the component (e.g., the insulating film) based on the first model function recited above. For example, a manufacturing condition value Xc is calculated by matrix inversion using the first model function; and it is determined to use the manufacturing condition value Xc that is calculated as the manufacturing condition value X of the processing conditions of the actual production.

The manufacturing control system 200 (the manufacturing control apparatus 201) actually forms the component (e.g., the insulating film) of the electronic device (e.g., the semiconductor memory device) using the manufacturing condition value X that is determined (step S120).

The manufacturing control system 200 (the manufacturing control apparatus 201) implements processing (step S130) to calculate the squared prediction error (SPE), i.e., the Q-statistic, of a measured value of the characteristic Y of the component for the first model function recited above using a measured value of the manufacturing condition value X and the measured value of the characteristic Y of the actual formation. The Q-statistic is calculated from the residual inside the space of the statistical data. The Q-statistic corresponds to the distance inside the space of the statistical data to the first model function inside the space.

The manufacturing control system 200 (the manufacturing control apparatus 201) performs processing (step S140) to determine whether or not the Q-statistic that is calculated is greater than a predetermined reference value.

Then, in the case where the Q-statistic that is calculated is greater than the predetermined reference value, the previous manufacturing condition value X (the first manufacturing condition value) is set to be a second manufacturing condition value of the next electronic device without correcting the model function. In other words, it is determined to use the previous value of the manufacturing condition value X as the manufacturing condition value X without correcting the model function (the second implementation of step S105).

On the other hand, in the case where the Q-statistic that is calculated is not more than the reference value, the second model function is generated using a database to which the measured value of the first manufacturing condition value X and the measured value of the characteristic Y of the component of the actual formation are added (step S150). Generating the second model function corresponds to, for example, correcting the first model function. The second model function relates to the relationship between the characteristic Y of the component (the insulating film) and second neighboring condition values which include the second processing condition value (e.g., the newest data 231) that was added and multiple processing condition values near the second processing condition value. Then, the second manufacturing condition value to obtain the characteristic Y of the component is determined based on the second model function that is generated (the second implementation of step S105). Continuing, the component is formed using the second manufacturing condition.

Thus, in the case where the Q-statistic is greater than the predetermined reference value, the first manufacturing condition value X is employed as the manufacturing condition (the second manufacturing condition) of the component of the next electronic device without correcting the first manufacturing condition value X based on the previous first model function; and in the case where the Q-statistic is not more than the reference value, a new second model function is generated, and the second manufacturing condition value is determined based on the new second model function. Thereby, it is possible to control the characteristic Y (the film thickness t) with high precision even in the case where irregular data, etc., occurs due to trouble, etc.

An example may be considered in which the irregularity determination is performed in the production process using the Q-statistic. Conversely, in the embodiment, it is determined, based on the result of the comparison between the Q-statistic and the reference value, whether or not to implement at least one selected from generating the model function (correcting the model function), calculating the manufacturing condition value X (the control item) from the model function, and using the manufacturing condition value X that is calculated from the model function in the actual manufacturing. In the embodiment, the Q-statistic is combined with, for example, the JITVM prediction model that can control the characteristic Y with higher precision. Thereby, a manufacturing control apparatus and a manufacturing control system of an electronic device that efficiently control the control items with high precision can be provided.

Figure 4:
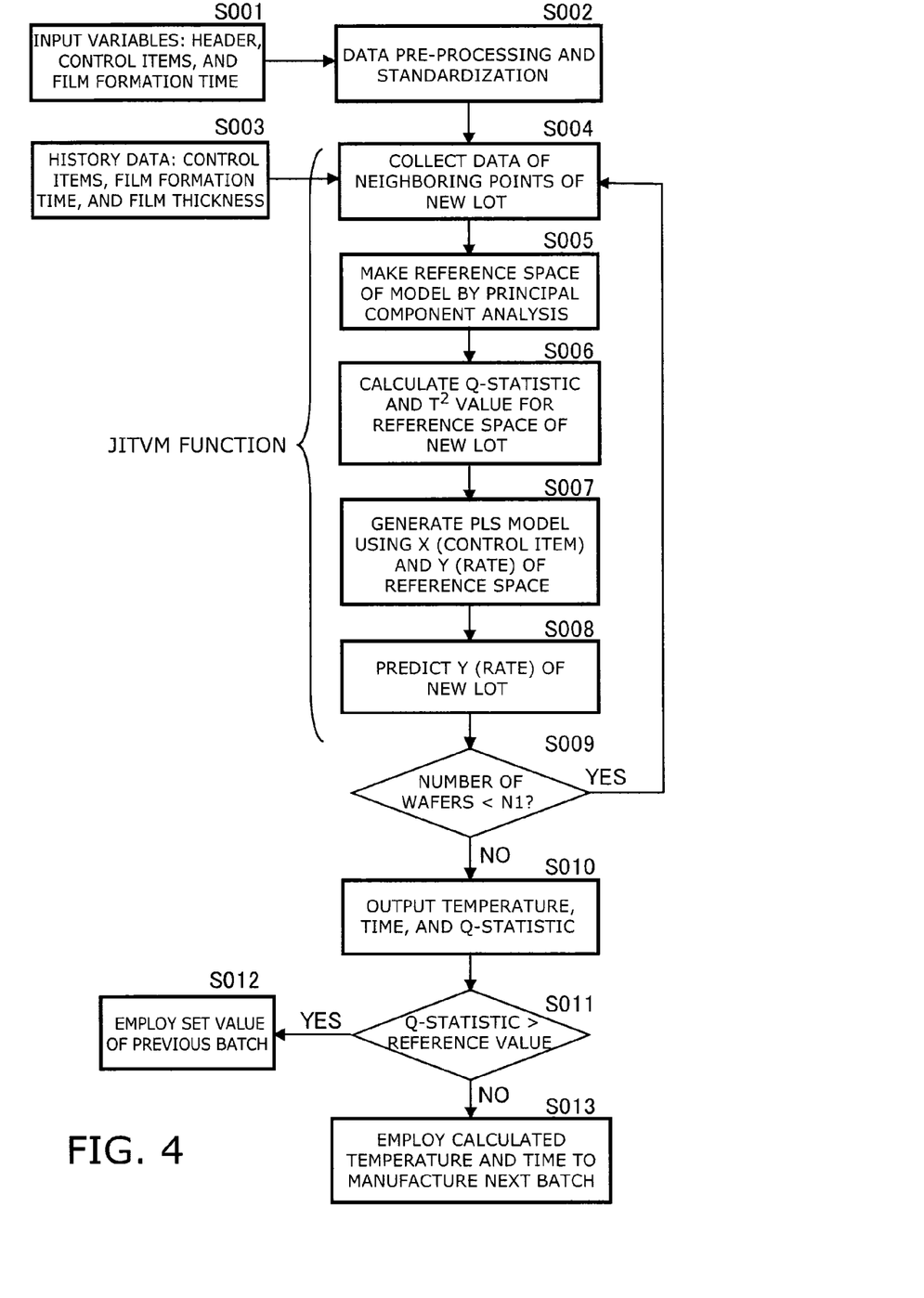
FIG. 4 is a flowchart showing the manufacturing control system of the electronic device according to the first embodiment.

FIG. 4 is a flowchart showing the manufacturing control system of the electronic device according to the first embodiment.

FIG. 4 shows the operation of the manufacturing control system 200 (the manufacturing control apparatus 201) according to the embodiment more specifically.

As shown in FIG. 4, for example, the header, the control items (e.g., the temperature, the pressure, etc.), and the film formation time are input as the input variables (step S001). The data pre-processing and standardization of the data is performed (step S002). Data such as the control items (e.g., the temperature, the pressure, etc.), the film formation time, the film thickness, etc., is input as the history data (step S003).

The data (e.g., Na sets) of neighboring points of the new lot is collected (step S004). The reference space of the model is made by principal component analysis (step S005). The Q-statistic is calculated for the reference space of the new lot (step S006).

The $T^2$ value may be calculated at this time. The $T^2$ value corresponds to the normalized distance from the origin in the space.

A PLS model relating to the control item (the manufacturing condition value X) and the characteristic Y (e.g., the film thickness and/or the film formation rate) of the reference space is generated (step S007). The characteristic Y (e.g., the film thickness and/or the film formation rate) of the new lot is predicted based on the PLS model (step S008).

For example, the number of wafers is compared to a predetermined value N1 (step S009). The wafers correspond to the test pieces; and, for example, the number of wafers is 4 in one example. In such a case, the value N1 is set to be 4. Then, in the case where the number of wafers is less than N1, the flow returns to step S004; and the processing recited above is implemented repeatedly. When the number of wafers becomes N1, the flow proceeds to step S010 (the output of the temperature, the time, and the Q-statistic).

The determination of whether or not the Q-statistic is greater than the predetermined reference value is performed (step S011). In the case where the Q-statistic is greater than the predetermined reference value, the set value (the first manufacturing condition value X) of the previous batch is employed (step S012). In the case where the Q-statistic is not more than the predetermined reference value, the temperature and the time that are calculated are employed as the condition values of the processing of the next batch.

The control items can be controlled efficiently with high precision by such processing.

Although it is determined whether or not to provide the feedback to the control item (the manufacturing condition value X) using the Q-statistic in the description recited above, the determination may be performed using at least one selected from the Q-statistic and the $T^2$ value.

Figure 5:
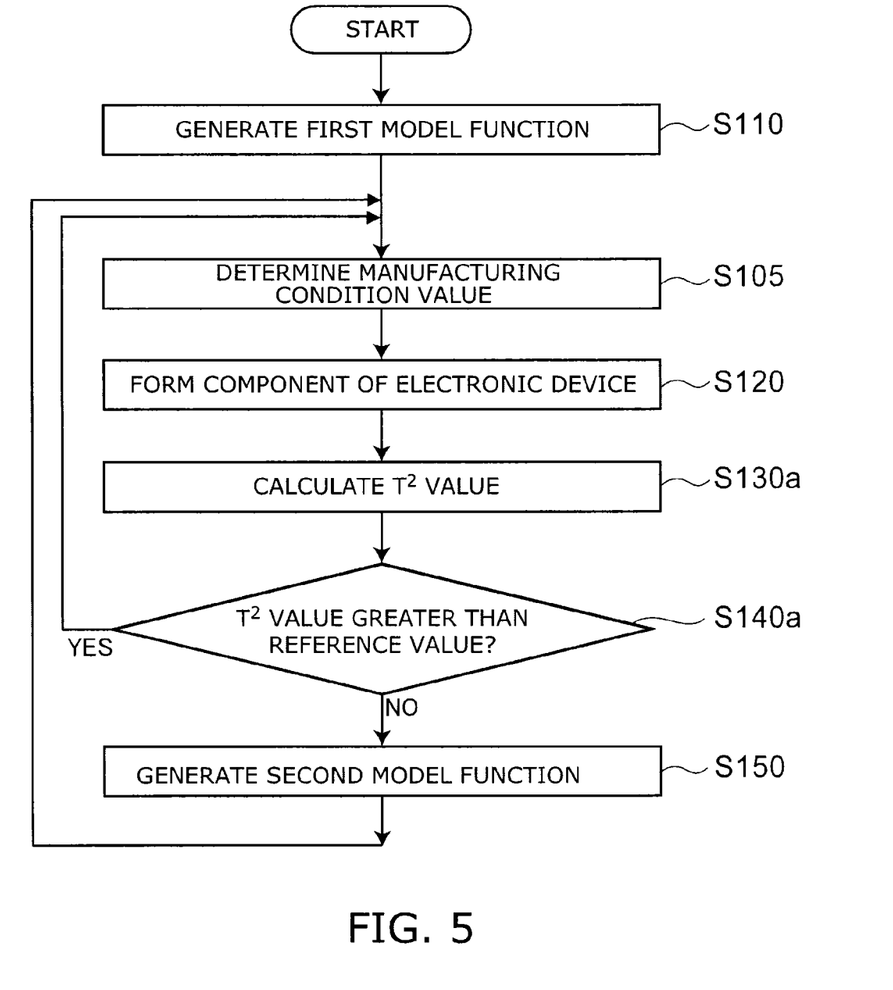
FIG. 5 is a flowchart showing another manufacturing control system of the electronic device according to the first embodiment.

FIG. 5 is a flowchart showing another manufacturing control system of the electronic device according to the first embodiment.

As shown in FIG. 5, processing (step S130a) is implemented to calculate the $T^2$ value of the measured value of the characteristic Y for the first model function recited above using the measured value of the manufacturing condition value X and the measured value of the characteristic Y of the component of the actual formation after implementing steps S110, S105, and S120.

The manufacturing control system 200 (the manufacturing control apparatus 201) performs processing (step S140a) to determine whether or not the $T^2$ value that is calculated is greater than a predetermined reference value.

Then, in the case where the $T^2$ value that is calculated is greater than the predetermined reference value, the previous manufacturing condition value X (the first manufacturing condition value) is set to be the second manufacturing condition value of the next electronic device without correcting the model function. In other words, it is determined to use the previous value as the manufacturing condition value X without correcting the model function (the second implementation of step S105).

On the other hand, in the case where the $T^2$ value that is calculated is not more than the reference value, the second model function is generated using a database to which the measured value of the first manufacturing condition value X and the measured value of the characteristic Y of the component of the actual formation are added (step S150). Generating the second model function corresponds to, for example, correcting the first model function. The second model function relates to the relationship between the characteristic Y of the component (the insulating film) and the second neighboring condition values including the second processing condition value (e.g., the newest data 231) that is added and multiple processing condition values near the second processing condition value. Then, the second manufacturing condition value to obtain the characteristic Y of the component is determined based on the second model function that is generated (the second implementation of step S105). Continuing, the component is formed using the second manufacturing condition.

In such a case as well, in the case where the $T^2$ value is greater than the predetermined reference value, the component of the electronic device is formed using the first manufacturing condition value X without correcting the first manufacturing condition value X based on the previous first model function; and in the case where the $T^2$ value is not more than the reference value, a new second model function is generated, and the second manufacturing condition value is determined based on the new second model function. Thereby, it is possible to control the characteristic Y (the film thickness t) with high precision even in the case where irregular data, etc., occurs due to trouble, etc.

Second Embodiment

When the product generation of the electronic device such as the semiconductor memory device, etc., changes, the data of the previous generations can no longer be used. Directly after starting the production of the next-generation product, the history data is insufficient because there is little data for the various measurement data for quality control. Therefore, it is difficult to perform manufacturing control that has sufficient precision when starting the production of the next-generation product.

Conversely, in the embodiment, the data corresponding to the next-generation product is generated by using the JITVM prediction model and by converting the data relating to a generation (the current generation, a previous generation, etc.) that precedes the next generation.

Figure 6:
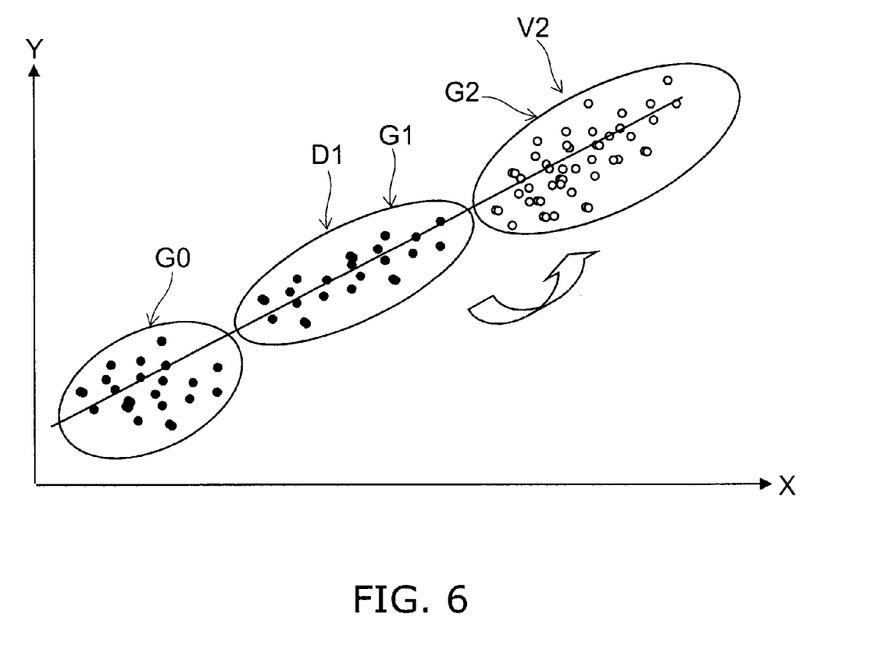
FIG. 6 is a model-like schematic view showing a database used in the manufacturing control system of the electronic device according to the second embodiment.

FIG. 6 is a model-like schematic view showing a database used in the manufacturing control system of the electronic device according to the second embodiment.

FIG. 6 shows the relationship between the control value (the manufacturing condition value X) and the characteristic Y for each generation of the electronic device. The horizontal axis is, for example, the temperature of the manufacturing condition value X. The vertical axis illustrates the reciprocal of the film thickness as the characteristic Y.

As shown in FIG. 6, the characteristic Y changes when a previous generation G0, a current generation G1, and a next generation G2 change. For example, the film thickness of the insulating film of the previous generation G0 is 48 nm (nanometers); the film thickness of the insulating film of the current generation G1 is 32 nm; and the film thickness of the insulating film of the next generation G2 is 24 nm. The data of the relationship between the manufacturing condition value X and the characteristic Y exists and is known for the previous generation G0 and the current generation G1. However, the data of the relationship between the manufacturing condition value X and the characteristic Y does not exist for the next generation G2.

In such a case, in the embodiment, a virtual database V2 is generated by converting the values of a database (a first database D1) that currently exists.

In other words, the virtual database V2 is generated using a model function based on the first database D1 that currently exists by assuming that the model function does not change when the generation changes. For example, the model function of Y'=f'(temperature, pressure, heater power) relating to the 24-nm generation (e.g., the next generation G2) is generated from the model function of Y=f(temperature, pressure, heater power, etc.) relating to the 32-nm generation (e.g., the current generation G1). For example, it is assumed that, as the generation changes, the target value of the characteristic Y (the film thickness) changes; the temperature (and the film formation time) change to match the change of the target value; and the other control items do not change. Thereby, the virtual database V2 relating to the next generation G2 can be generated by converting the values of the first database D1 relating to the current generation G1 by changing the temperature (and the film formation time) using the model function relating to the current generation G1.

Thus, in the embodiment, the virtual database V2 when modifying the specification of the electronic device is generated by converting the values of the first database D1 to reflect the change of the characteristic Y of the component (e.g., the insulating film) according to the modification of the specification.

Thereby, the manufacturing control can be performed with higher precision directly after starting the production of the next generation G2 by using the virtual database V2.

Figure 7:
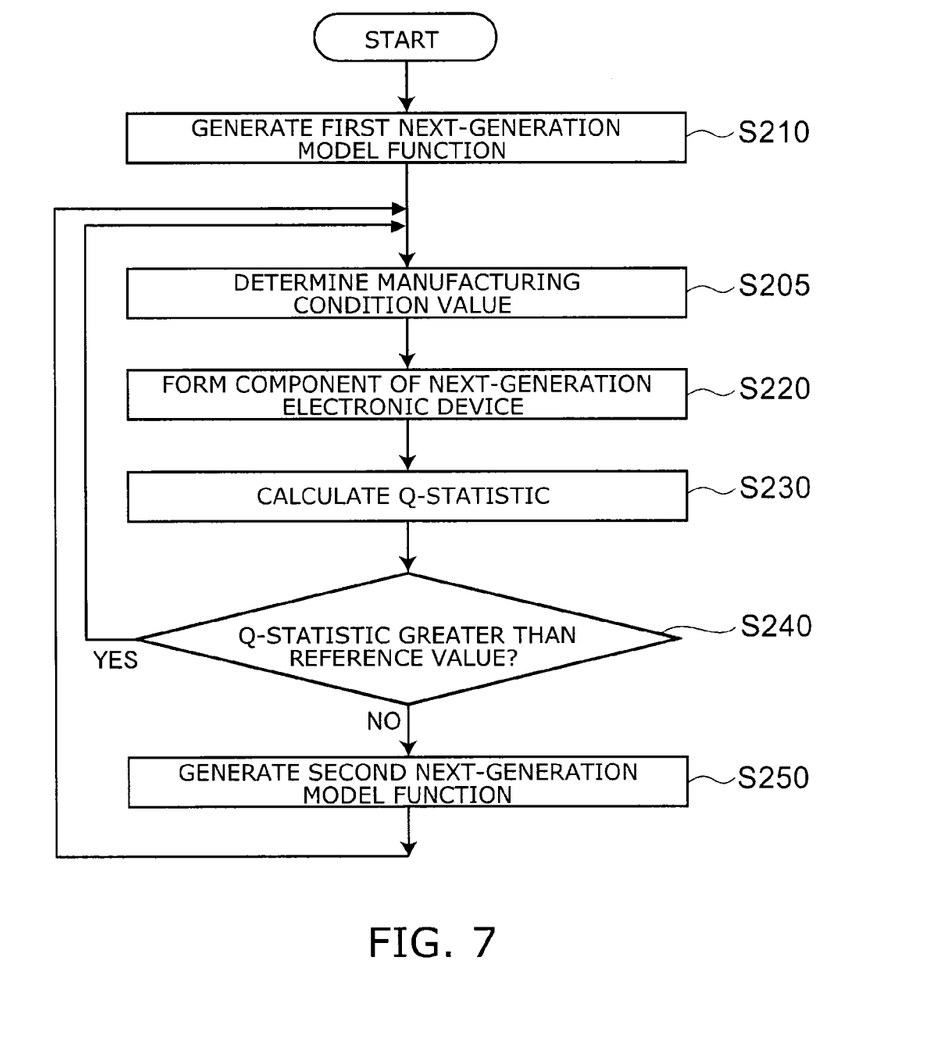
FIG. 7 is a flowchart showing a manufacturing control system of the electronic device according to the second embodiment.

FIG. 7 is a flowchart showing a manufacturing control system of the electronic device according to the second embodiment.

As shown in FIG. 7, the manufacturing control system 200 (the manufacturing control apparatus 201) according to the embodiment generates, for example, a first next-generation model function relating to the relationship between the characteristic Y of the component and the next-generation neighboring condition values of the manufacturing condition value X including a predetermined next-generation processing condition value and multiple processing condition values near the next-generation processing condition value using the virtual database V2 (step S210).

Then, the next-generation manufacturing condition value to obtain the characteristic of the component is determined based on the first next-generation model function (step S205).

Continuing, the component of the electronic device (the next-generation product) is actually formed using the next-generation manufacturing condition that is determined (step S220).

Thereby, the manufacturing control can be performed with higher precision directly after starting the production of the next-generation product by using the virtual database V2.

In such a case as well, as described below, processing similar to step S130 to step S150 of the first embodiment may be implemented.

In other words, the Q-statistic (the squared prediction error) of the measured value of the characteristic Y for the first next-generation model function is calculated using the measured value of the next-generation manufacturing condition value and the measured value of the characteristic Y of the component when actually forming the component of the next-generation electronic device using the next-generation manufacturing condition value that is determined (step S230).

The determination of whether or not the Q-statistic that is calculated is greater than the predetermined reference value is performed (step S240). In the case where the Q-statistic is greater than the reference value, the manufacturing condition value (the next-generation manufacturing condition value) used in the processing of the previous production is set to be the second manufacturing condition value of the next next-generation electronic device without correcting the model function (corresponding to the second implementation of step S205). In the case where the Q-statistic is not more than the reference value, a second next-generation model function is generated using the virtual database V2 to which the measured value of the next-generation manufacturing condition value and the measured value of the characteristic Y of the component of the actual formation are added (step S250). Then, a second implementation of the determination of the second manufacturing condition value of the next next-generation electronic device is performed (corresponding to the second implementation of step S205).

Thus, the virtual database V2 relating to the next-generation product is generated; and processing similar to that described in regard to FIG. 3 can be implemented based on the virtual database V2.

Thereby, the control items can be controlled efficiently with high precision directly after starting the production of the next-generation electronic device. In such a case as well, a determination using the $T^2$ value instead of the Q-statistic may be performed.

Further, a database that is closer to the actual data can be generated by replacing the virtual data with actual data obtained after starting the production of the next-generation electronic device. Thereby, the production control can be implemented with higher precision.

Figure 8:
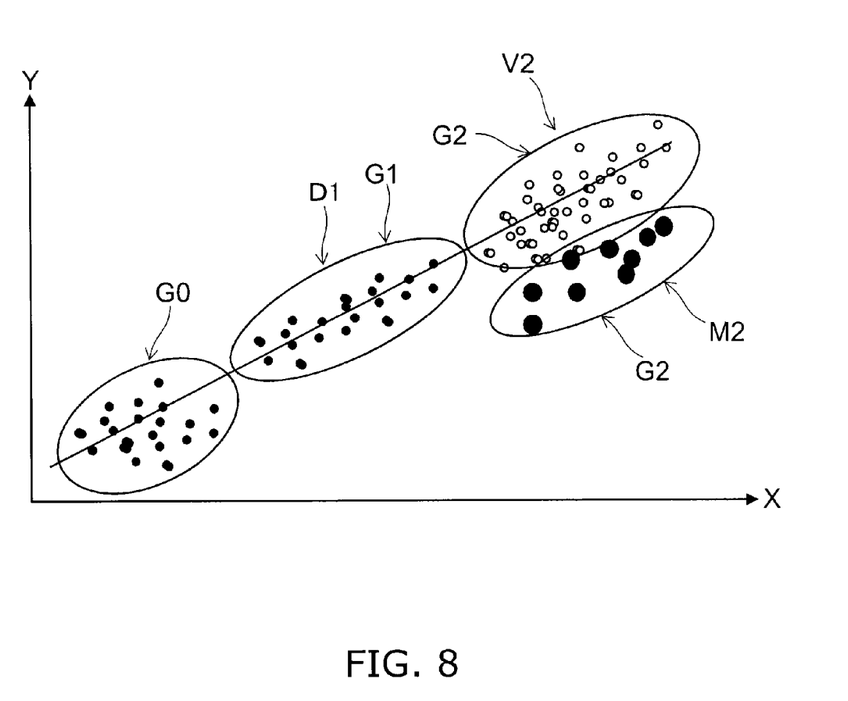
FIG. 8 is a model-like schematic view showing the database used in the manufacturing control system of the electronic device according to the second embodiment.

FIG. 8 is a model-like schematic view showing the database used in the manufacturing control system of the electronic device according to the second embodiment.

As shown in FIG. 8, the virtual database V2 relating to the next generation G2 is formed; the processing of the actual production is performed; and actual next-generation measurement data M2 is obtained. In other words, steps S210 to S250 recited above are implemented; the data relating to the next-generation manufacturing condition value X (the temperature, etc.) at this time and the characteristic Y (the film thickness) at this time is acquired; and these values are added to the database. The measured value of the next-generation manufacturing condition value and the measured value of the characteristic Y of the component of the actual formation are added to the virtual database V2; and the combination of the manufacturing condition value of the virtual database V2 nearest the next-generation manufacturing condition value and the value of the characteristic Y of the component corresponding to the nearest manufacturing condition value is erased.

At this time, for example, processing such as the following is performed. For example, the values of a database of the entirety including the first database D1 of the current generation G1, the virtual database V2 of the next generation G2, and the newly-obtained next-generation measurement data M2 are used as the reference space. Then, the model function of the reference space is calculated. Continuing, the Q-statistic of the virtual database V2 for the model function is calculated. Then, the data of the virtual database V2 having the largest Q-statistic is deleted. Continuing, the actual measurement data is added to replace the virtual data that was deleted.

Thus, when starting the production of the next-generation product, the production is started using the virtual database V2 made of only the virtual data; subsequently, the production is started; and the virtual data is replaced with the actual measurement data each time the actual measurement data is obtained. Thereby, the state of the production of the next-generation product can be quickly brought to a good state by performing the manufacturing control with higher precision.

As a method for correcting the virtual data based on the actual measurement data, the centroid (the position inside the X-Y space) of the actual measurement data group may be calculated; and a translation of the centroid of the virtual database V2 inside the X-Y space to the position of the centroid of the actual measurement data group may be performed. Thereby, the state of the production of the next-generation product can be quickly brought to a good state by performing the manufacturing control with higher precision.

Third Embodiment

The manufacturing control system 200 according to the embodiment includes the manufacturing control apparatus 201 recited above, a formation apparatus (e.g., the LP-CVD apparatus 210) that forms the component included in the electronic device, and a measuring apparatus (e.g., the film thickness measuring apparatus 202) that measures the characteristic Y. According to the embodiment, a manufacturing control system of an electronic device that efficiently controls the control items with high precision can be provided.

Fourth Embodiment

A manufacturing control program according to the embodiment causes a computer to implement, for example, the processing shown in FIG. 3.

In other words, the program causes the computer to implement processing to generate the first model function relating to the relationship between the characteristic Y of the component included in the electronic device and the first neighboring condition values of the manufacturing condition value X relating to the component using the first database, where the manufacturing condition value X and the characteristic Y including at least one selected from a value relating to the thickness of the component and a value relating to a dimension of the component when manufactured using the manufacturing condition value X are stored with a mutual correlation in the first database, and the first neighboring condition values include a predetermined first processing condition value and multiple processing condition values near the first processing condition value.

The program causes the computer to implement processing to determine the first manufacturing condition value to obtain the characteristic Y of the component based on the first model function recited above.

The program causes the computer to implement processing to calculate the Q-statistic (the squared prediction error) of the measured value of the characteristic Y for the first model function using the measured value of the first manufacturing condition value and the measured value of the characteristic Y of the component when actually forming the component of the electronic device using the first manufacturing condition value that is determined.

The program causes the computer to set the previous manufacturing condition value (the first manufacturing condition value) to be the second manufacturing condition value of the next electronic device without correcting the model function in the case where the Q-statistic that is calculated is greater than the predetermined reference value. Then, in the case where the Q-statistic that is calculated is not more than the reference value, processing is implemented to generate the second model function using the first database to which the measured value of the first manufacturing condition value and the measured value of the characteristic Y of the component of the actual formation are added, and to determine the second manufacturing condition value to obtain the characteristic Y of the component based on the second model function. Then, manufacturing is performed using the second manufacturing condition that is determined.

According to the embodiment, a manufacturing control program of an electronic device that efficiently controls the control items with high precision can be provided.

According to the embodiments, a manufacturing control apparatus, a manufacturing control system, and a manufacturing control program of an electronic device that efficiently control the control items with high precision are provided.

Hereinabove, exemplary embodiments of the invention are described with reference to specific examples. However, the invention is not limited to these specific examples. For example, one skilled in the art may similarly practice the invention by appropriately selecting specific configurations of components from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all manufacturing control apparatuses, manufacturing control systems, and manufacturing control programs of an electronic device practicable by an appropriate design modification by one skilled in the art based on the manufacturing control apparatuses, manufacturing control systems, and manufacturing control programs of an electronic device described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A manufacturing control apparatus of an electronic device, the apparatus being configured to implement:
    processing to generate, using a first database, a first model function relating to a relationship between a characteristic of a component included in the electronic device and first neighboring condition values of a manufacturing condition value relating to the component, the first neighboring condition values including a predetermined first processing condition value and a plurality of processing condition values near the first processing condition value, the characteristic including at least one selected from a value relating to a thickness of the component and a value relating to a dimension of the component when manufactured using the manufacturing condition value, the manufacturing condition value and the characteristic being stored with a mutual correlation in the first database;
    processing to determine a first manufacturing condition value to obtain the characteristic of the component based on the first model function;
    processing to calculate a squared prediction error of a measured value of the characteristic of the component for the first model function using the measured value of the characteristic and a measured value of the first manufacturing condition value when actually forming the component of the electronic device using the determined first manufacturing condition value;
    processing to set, in the case where the calculated squared prediction error is greater than a predetermined reference value, the first manufacturing condition value to be a second manufacturing condition value of the next electronic device without correcting the first model function, and to determine, in the case where the calculated squared prediction error is not more than the reference value, the second manufacturing condition value to obtain the characteristic of the component based on a second model function by generating the second model function using the first database including the addition of the measured value of the first manufacturing condition value and the measured value of the characteristic of the component of the actual forming; and
    processing to generate a virtual database when modifying a specification of the electronic device by converting values of the first database using a proportional operation to reflect a change of the characteristic of the component according to the modification of the specification; wherein the apparatus can communicate with a formation apparatus configured to form the component included in the electronic device.

2. The apparatus according to claim 1, configured to further implement:
    processing to generate, using the virtual database, a next-generation model function relating to a relationship between the characteristic of the component and next-generation neighboring condition values of the manufacturing condition value including a predetermined next-generation processing condition value and a plurality of processing condition values near the next-generation processing condition value;
    processing to determine a next-generation manufacturing condition value to obtain the characteristic of the component based on the next-generation model function;
    processing to actually form the component of the electronic device using the determined next-generation manufacturing condition value; and
    processing to add a measured value of the next-generation manufacturing condition value and a measured value of the characteristic of the component of the actual forming to the virtual database and erase a combination of the manufacturing condition value of the virtual database nearest the next-generation manufacturing condition value and the value of the characteristic of the component corresponding to the nearest manufacturing condition value.

3. The apparatus according to claim 2, wherein the processing to erase the combination of the manufacturing condition value and the value of the characteristic is configured to use the values of a database of the entirety including the first database, the virtual database, and the newly-obtained next-generation measurement data as a reference space, calculate a model function of the reference space, calculate the squared prediction error of the virtual database for the model function, delete the data of the virtual database having the largest calculated squared prediction error, and add the actual measurement data to replace the deleted data.

4. The apparatus according to claim 3, configured to further implement processing to calculate a centroid of a group of the actual measurement data and perform a translation of a centroid of the virtual database to the position of the centroid of the group of the actual measurement data.

5. The apparatus according to claim 1, wherein the apparatus can communicate with a measuring apparatus configured to measure the characteristic.

6. The apparatus according to claim 1, wherein the component includes an insulating film.

7. The apparatus according to claim 6, wherein the manufacturing condition value includes at least a temperature of film formation and a pressure of a processing chamber.

8. The apparatus according to claim 1, wherein the processing to determine the first manufacturing condition value is configured to calculate the manufacturing condition value by matrix inversion using the first model function and determine the calculated manufacturing condition value as the first manufacturing condition value.

9. The apparatus according to claim 1, wherein the processing to calculate the squared prediction error further includes processing to calculate a $T^2$ value of the measured value of the characteristic for the first model function using the measured value of the first manufacturing condition value and the measured value of the characteristic of the component when actually forming the component of the electronic device using the determined first manufacturing condition value, and at least one selected from the squared prediction error and the $T^2$ value is calculated.

10. The apparatus according to claim 9, wherein the processing to determine the second manufacturing condition value is configured to set, in the case where the calculated $T^2$ value is greater than a predetermined reference value, the first manufacturing condition value to be the second manufacturing condition value of the next electronic device without correcting the model function, and determine, in the case where the calculated $T^2$ value is not more than the reference value, the second manufacturing condition value to obtain the characteristic of the component based on the second model function by generating the second model function using the first database including the addition of the measured value of the first manufacturing condition value and the measured value of the characteristic of the component of the actual forming.

11. The apparatus according to claim 1, wherein the first model function is expressed as $Y=\alpha \cdot X$, where the manufacturing condition value is X, the characteristic is Y, and a coefficient of the manufacturing condition value is $\alpha$.

12. A manufacturing control system of an electronic device, the system comprising:
a manufacturing control apparatus of the electronic device, the manufacturing control apparatus being configured to implement:
processing to generate, using a first database, a first model function relating to a relationship between a characteristic of a component included in the electronic device and first neighboring condition values of a manufacturing condition value relating to the component, the first neighboring condition values including a predetermined first processing condition value and a plurality of processing condition values near the first processing condition value, the characteristic including at least one selected from a value relating to a thickness of the component and a value relating to a dimension of the component when manufactured using the manufacturing condition value, the manufacturing condition value and the characteristic being stored with a mutual correlation in the first database,
processing to determine a first manufacturing condition value to obtain the characteristic of the component based on the first model function,
processing to calculate a squared prediction error of a measured value of the characteristic of the component for the first model function using the measured value of the characteristic and a measured value of the first manufacturing condition value when actually forming the component of the electronic device using the determined first manufacturing condition value,
processing to set, in the case where the calculated squared prediction error is greater than a predetermined reference value, the first manufacturing condition value to be a second manufacturing condition value of the next electronic device without conecting the first model function, and to determine, in the case where the calculated squared prediction error is not more than the reference value, the second manufacturing condition value to obtain the characteristic of the component based on a second model function by generating the second model function using the first database including the addition of the measured value of the first manufacturing condition value and the measured value of the characteristic of the component of the actual forming, and
processing to generate a virtual database when modifying a specification of the electronic device by converting values of the first database using a proportional operation to reflect a change of the characteristic of the component according to the modification of the specification; and
a formation apparatus configured to form the component included in the electronic device.

13. The system according to claim 12, wherein the manufacturing control apparatus is configured to further implement:
processing to generate, using the virtual database, a next-generation model function relating to a relationship between the characteristic of the component and next-generation neighboring condition values of the manufacturing condition value including a predetermined next-generation processing condition value and a plurality of processing condition values near the next-generation processing condition value;
processing to determine a next-generation manufacturing condition value to obtain the characteristic of the component based on the next-generation model function;
processing to actually form the component of the electronic device using the determined next-generation manufacturing condition value; and
processing to add the measured value of the next-generation manufacturing condition value and the measured value of the characteristic of the component of the actual forming to the virtual database and erase a combination of the manufacturing condition value of the virtual database nearest the next-generation manufacturing condition value and the value of the characteristic of the component corresponding to the nearest manufacturing condition value.

14. The system according to claim 12, further comprising a measuring apparatus configured to measure the characteristic.

* * * * *